(12) United States Patent
Nishimoto et al.

(10) Patent No.: US 8,914,715 B2
(45) Date of Patent: Dec. 16, 2014

(54) SOFT DECISION VALUE GENERATION CIRCUIT TO REDUCE CALCULATION AMOUNTS AND HARDWARE SCALE

(75) Inventors: Hiroshi Nishimoto, Tokyo (JP); Akira Kurita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/879,177

(22) PCT Filed: Nov. 4, 2011

(86) PCT No.: PCT/JP2011/075458
§ 371 (c)(1),
(2), (4) Date: Apr. 12, 2013

(87) PCT Pub. No.: WO2012/070369
PCT Pub. Date: May 31, 2012

(65) Prior Publication Data
US 2013/0205184 A1 Aug. 8, 2013

(30) Foreign Application Priority Data

Nov. 26, 2010 (JP) ................................. 2010-263554

(51) Int. Cl.
*H03M 13/00* (2006.01)
(Continued)

(52) U.S. Cl.
CPC ............ *G06F 11/10* (2013.01); *H04L 27/2273* (2013.01); *H04L 25/03318* (2013.01); *H03M 13/255* (2013.01); *H04L 25/067* (2013.01)
USPC ........... 714/780; 714/786; 714/752; 375/316; 375/340; 375/341

(58) Field of Classification Search
USPC ........................................................ 714/780
See application file for complete search history.

(56) References Cited

U.S. PATENT DOCUMENTS 5,920,599 A 7/1999 Igarashi
7,421,638 B2 * 9/2008 Hewitt et al. .................. 714/755
(Continued)

FOREIGN PATENT DOCUMENTS

EP   0 987 863 A1   3/2000
JP   10 75274      3/1998
(Continued)

OTHER PUBLICATIONS

Matsuoka, H., et al., "Adaptive Modulation System with Punctured Convolutional Code for High Quality Personal Communication Systems," IEICE Trans. Commun., vol. E79-B, No. 3, pp. 328-334, (Mar. 1996).

(Continued)

*Primary Examiner* — Justin R Knapp
(74) *Attorney, Agent, or Firm* — Oblon, Spivak, McClelland, Maier & Neustadt, L.L.P.

(57) ABSTRACT

A soft decision value generation circuit capable of reducing amount of calculation and hardware scale for generating a soft decision value. The soft decision value generation circuit includes: a phase rotation unit rotating phases of received symbols after coherent detection; addition units calculating, by using the phase-rotated received symbols, absolute values of soft decision values for soft decision value candidates restricted in advance; minimum value selection units selecting minimum values out of the absolute values of the soft decision values; sign reflection units reflecting, based on the phases of the received symbols after the phase rotation, sign information to the minimum values; and soft decision value correction units multiplying outputs of the sign reflection units by a coefficient depending on a noise variance value and an amplitude value of a modulation symbol.

15 Claims, 10 Drawing Sheets

(51) Int. Cl.

| | |
|---|---|
| *H03M 13/45* | (2006.01) |
| *H04L 27/227* | (2006.01) |
| *G06F 11/10* | (2006.01) |
| *H04L 25/03* | (2006.01) |
| *H03M 13/25* | (2006.01) |
| *H04L 25/06* | (2006.01) |
| *H04L 27/06* | (2006.01) |

(56) References Cited

U.S. PATENT DOCUMENTS

| | | | |
|---|---|---|---|
| 7,860,191 B2* | 12/2010 | Qi et al. | 375/330 |
| 7,995,678 B2* | 8/2011 | Norris et al. | 375/330 |
| 8,023,833 B2* | 9/2011 | Malouin et al. | 398/202 |
| 8,144,815 B2* | 3/2012 | Norris | 375/324 |
| 8,208,585 B2* | 6/2012 | Qi et al. | 375/324 |
| 2006/0212781 A1 | 9/2006 | Hewitt et al. | |
| 2008/0063043 A1* | 3/2008 | Xia et al. | 375/233 |
| 2008/0279299 A1 | 11/2008 | Reuven et al. | |
| 2009/0041165 A1 | 2/2009 | Higashinaka | |
| 2010/0091912 A1 | 4/2010 | Park et al. | |
| 2010/0169745 A1 | 7/2010 | Motozuka | |
| 2012/0189324 A1* | 7/2012 | Mo et al. | 398/202 |

FOREIGN PATENT DOCUMENTS

| | | |
|---|---|---|
| JP | 2002 217748 | 8/2002 |
| WO | 2004 073247 | 8/2004 |
| WO | 2004 073248 | 8/2004 |
| WO | 2007 040018 | 4/2007 |
| WO | 2008 023682 | 2/2008 |

OTHER PUBLICATIONS

Nishimoto, H., et al., "Blind Iterative Decoding in Bit-Interleaved Coded DPSK," The 11th International Symposium on Wireless Personal Multimedia Communications (WPMC'08), Total 5 Pages, (Sep. 2008).

International Search Report Issued Jan. 10, 2012 in PCT/JP11/75458 Filed Nov. 4, 2011.

Chinese Office Action issued Mar. 31, 2014, in China Patent Application No. 201180056527.0 (with English translation).

Extended European Search Report issued Mar. 27, 2014 in Patent Application No. 11843792.0.

\* cited by examiner

| $b_0$ | $b_1$ | PHASE DEVIATION | $s_0$ | $s_1$ |
|---|---|---|---|---|
| 0 | 0 | 0 | $q_0, q_1, q_2, q_3$ | $q_0, q_1, q_2, q_3$ |
| 1 | 0 | $\pi/2$ | $q_0, q_1, q_2, q_3$ | $q_1, q_2, q_3, q_0$ |
| 1 | 1 | $\pi$ | $q_0, q_1, q_2, q_3$ | $q_2, q_3, q_0, q_1$ |
| 0 | 1 | $3\pi/2$ | $q_0, q_1, q_2, q_3$ | $q_3, q_0, q_1, q_2$ |

| ITEM NUMBER | TRANSITION $(q_i \rightarrow q_j)$ | $\left.\|r_0'-q_i\|^2 + \|r_1'-q_j\|^2\right\|_{(q_i,q_j) \in D(b_0=1)}$ | COMPARISON |
|---|---|---|---|
| (1) | $q_0 \rightarrow q_1$ | $\|r_0'-q_0\|^2 + \|r_1'-q_1\|^2$ | — |
| (2) | $q_0 \rightarrow q_2$ | $\|r_0'-q_0\|^2 + \|r_1'-q_2\|^2$ | $> (1) \; (\|r_1'-q_2\|^2 > \|r_1'-q_1\|^2)$ |
| (3) | $q_1 \rightarrow q_2$ | $\|r_0'-q_1\|^2 + \|r_1'-q_2\|^2$ | $> (4) \; (\|r_1'-q_2\|^2 > \|r_1'-q_3\|^2)$ |
| (4) | $q_1 \rightarrow q_3$ | $\|r_0'-q_1\|^2 + \|r_1'-q_3\|^2$ | — |
| (5) | $q_2 \rightarrow q_3$ | $\|r_0'-q_2\|^2 + \|r_1'-q_3\|^2$ | $> (6) \; (\|r_1'-q_3\|^2 > \|r_1'-q_0\|^2)$ |
| (6) | $q_2 \rightarrow q_0$ | $\|r_0'-q_2\|^2 + \|r_1'-q_0\|^2$ | $> (7) \; (\|r_0'-q_2\|^2 > \|r_0'-q_3\|^2)$ |
| (7) | $q_3 \rightarrow q_0$ | $\|r_0'-q_3\|^2 + \|r_1'-q_0\|^2$ | — |
| (8) | $q_3 \rightarrow q_1$ | $\|r_0'-q_3\|^2 + \|r_1'-q_1\|^2$ | $> (7) \; (\|r_1'-q_1\|^2 > \|r_1'-q_0\|^2)$ |

FIG. 5

| ITEM NUMBER | TRANSITION ($q_i \to q_j$) | $\|r_0' - q_i\|^2 + \|r_1' - q_j\|^2 - \|r_0' - q_0\|^2 - \|r_1' - q_0\|^2$ |
|---|---|---|
| (1) | ($q_0 \to q_1$) | $4ax_1$ |
| (4) | ($q_1 \to q_3$) | $4a(x_0 + y_1)$ |
| (7) | ($q_3 \to q_0$) | $4ay_0$ |

FIG. 6

| $r_1'$ | CANDIDATE VALUE OF $\lambda(b_0 \mid r_0, r_1)$ | | CANDIDATE VALUE OF $\lambda(b_1 \mid r_0, r_1)$ | |
|---|---|---|---|---|
| FIRST QUADRANT | $x_1$ | $y_0$ | $x_0 + y_1$ | $y_1$ | $x_0$ | $x_1 + y_0$ |
| SECOND QUADRANT | $x_1$ | $-x_0$ | $-y_0 - y_1$ | $y_1$ | $y_0$ | $x_0 - x_1$ |
| THIRD QUADRANT | $x_1$ | $-y_0$ | $-x_0 + y_1$ | $y_1$ | $-x_0$ | $x_1 - y_0$ |
| FOURTH QUADRANT | $x_1$ | $x_0$ | $y_0 - y_1$ | $y_1$ | $-y_0$ | $-x_0 - x_1$ |

FIG. 7

| PHASE (QUADRANT) OF $r_0 = (u_0, v_0)$ | ROTATION AMOUNT | ROTATION RESULT | |
|---|---|---|---|
| | | $r_0' = (x_0, y_0)$ | $r_1' = (x_1, y_1)$ |
| $u_0 \geq 0, v_0 \geq 0$ | 0 | $(u_0, v_0)$ | $(u_1, v_1)$ |
| $u_0 < 0, v_0 \geq 0$ | $3\pi/2$ | $(v_0, -u_0)$ | $(v_1, -u_1)$ |
| $u_0 < 0, v_0 < 0$ | $\pi$ | $(-u_0, -v_0)$ | $(-u_1, -v_1)$ |
| $u_0 \geq 0, v_0 < 0$ | $\pi/2$ | $(-v_0, u_0)$ | $(-v_1, u_1)$ |

FIG. 8

| SUBJECT BIT | PHASE OF $r_1' = (x_1, y_1)$ | SOFT DECISION VALUE CANDIDATE | | |
|---|---|---|---|---|
| BIT $b_0$ | $x_1 \geq 0, y_1 \geq 0$, OR $x_1 < 0, y_1 < 0$ | $\|x_1\|$ | $y_0$ | $x_0 + \|y_1\|$ |
| | $x_1 < 0, y_1 \geq 0$, OR $x_1 < 0, y_1 \geq 0$ | | $y_0 + \|y_1\|$ | $x_0$ |
| BIT $b_1$ | $x_1 \geq 0, y_1 \geq 0$, OR $x_1 < 0, y_1 < 0$ | $\|y_1\|$ | $x_0$ | $y_0 + \|x_1\|$ |
| | $x_1 < 0, y_1 < 0$, OR $x_1 < 0, y_1 \geq 0$ | | $x_0 + \|x_1\|$ | $y_0$ |

FIG. 9

| SUBJECT BIT | PHASE OF $r_1' = (x_1, y_1)$ | SIGN |
|---|---|---|
| BIT $b_0$ | $x_1 \geqq 0$ | POSITIVE |
| | $x_1 < 0$ | NEGATIVE |
| BIT $b_1$ | $y_1 \geqq 0$ | POSITIVE |
| | $y_1 < 0$ | NEGATIVE |

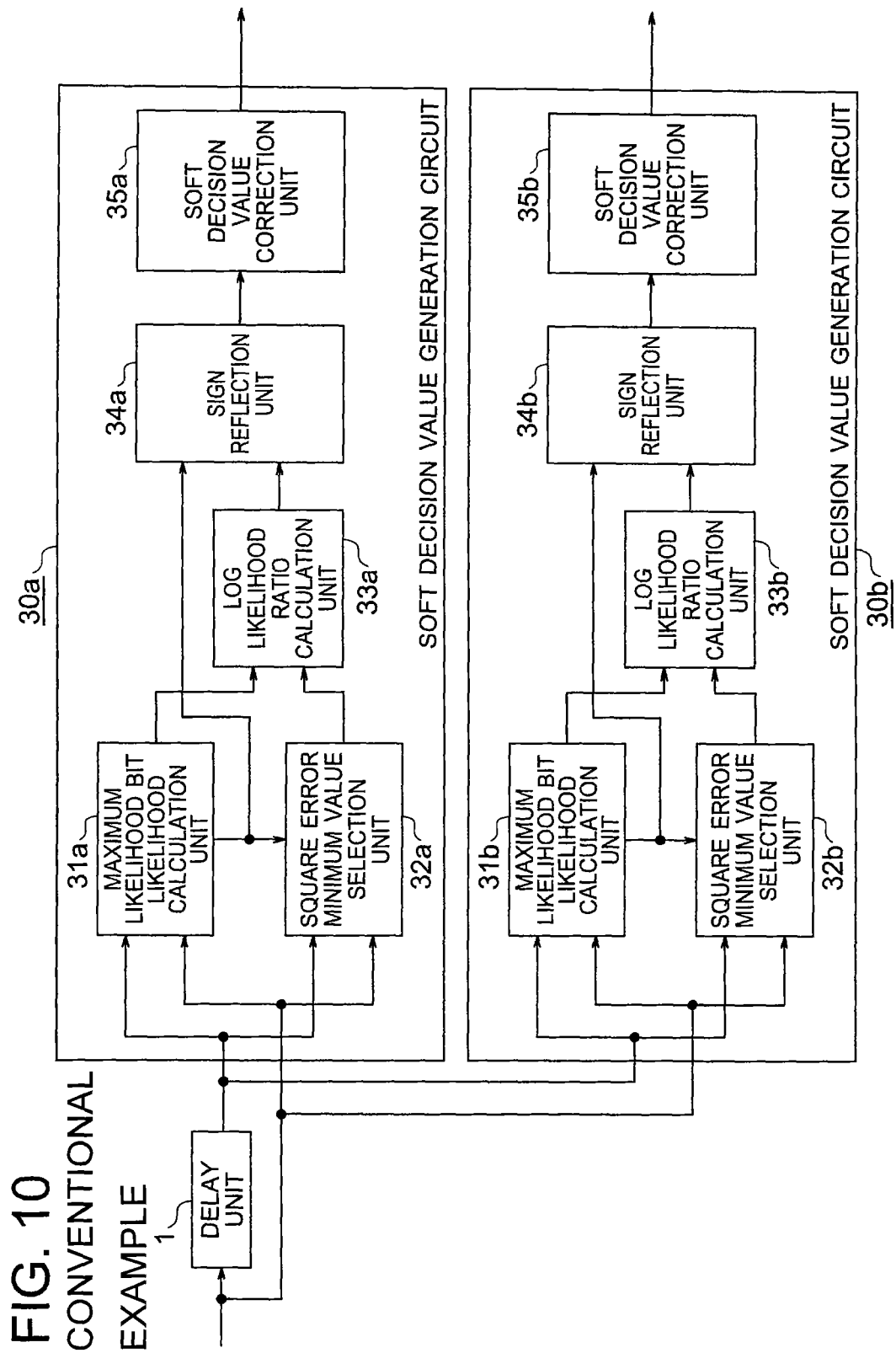
FIG. 10 CONVENTIONAL EXAMPLE

SOFT DECISION VALUE GENERATION CIRCUIT TO REDUCE CALCULATION AMOUNTS AND HARDWARE SCALE

TECHNICAL FIELD

The present invention relates to a soft decision value generation circuit included in a reception device and the like in a digital communication system.

BACKGROUND ART

In digital communication, usually, the error correction which corrects an error in data generated in a transmission line is often used. The error correction is realized by error correction encoding on a transmission side and error correction decoding on a reception side.

There are several types of error correction encoding, and in recent years, as codes having a high error correction capability, the Turbo code and the LDPC code are known. These codes provide a high error correction effect respectively by the Turbo decoding and the LDPC decoding on the reception side.

Information input to those decoders is generally referred to as "soft decision value". Digital data has bit information, which is "0" or "1", and therefore, there are a method of inputting information determined as a binary value (referred to as "hard decision value"), which is 0 or 1, to a decoder, and a method of inputting, instead of the binary value, a soft decision value represented as a probability, a likelihood, or a log likelihood of being 0 or 1 to the decoder. In particular, the latter method is referred to as soft decision decoding, is high in compatibility with the Turbo decoding and the LDPC decoding, and provides a high error correction effect compared with the former method (referred to as hard decision decoding).

A circuit for generating a soft decision value provided for the decoder is referred to as a soft decision value generation circuit. The soft decision value generation circuit generates a soft decision value from a received signal (the signal is hereinafter referred to as symbol) depending on a used digital modulation scheme. In digital communication assuming coherent detection, generally digital modulation schemes such as the phase shift keying (PSK) and the quadrature amplitude modulation (QAM), which are excellent in transmission characteristic, are used. Generation methods for the soft decision value in the PSK and the QAM are disclosed in, for example, Non-Patent Literature 1.

On the other hand, in the binary PSK (BPSK) or the quadrature PSK (QPSK), there are modulation methods such as differentially encoded (DE) BPSK and DEQPSK of differentially encoding modulation symbols. The differentially encoded modulation symbols can be decoded (soft decision value can be generated) by carrying out delay detection in the receiver, and usually eliminate necessity of the coherent detection. It should be noted, however, that by carrying out the coherent detection in the receiver, a higher reception capability than that obtained when the delay detection is carried out can be provided (for example, Non-Patent Literature 2 reports the reception capability).

In Patent Literature 1, in the modulation scheme which employs differential encoding, such as the DBPSK and the DEQPSK, an invention involving respectively obtaining, for a received symbol, the minimum value in error from a pattern (modulation symbol candidate) causing a transmitted bit to be 1 and the minimum value in error from a modulation symbol candidate causing a transmitted bit to be 0, and setting a difference thereof as reliability information, namely as a soft decision value is disclosed.

CITATION LIST

Patent Literature

[PTL 1] JP 10-75274 A

Non Patent Literature

[NPL 1] Hidehiro Matsuoka, Seiichi Sampei, Norihiko Morinaga, and Yukiyoshi Kamio, "Adaptive Modulation System with Punctured Convolutional Code for High Quality Personal Communication Systems" IEICE Trans. Commun., vol. E79-B, no. 3, pp. 328-334, March 1996.

[NPL 2] Hiroshi Nishimoto, Toshihiko Nishimura, Takeo Ohgane, and Yasutaka Ogawa, "Blind Iterative Decoding in Bit-Interleaved Coded DPSK," Proc. WPMC2008, CC2-4, September 2008.

SUMMARY OF INVENTION

Technical Problem

However, the invention according to Patent Literature 1 corresponds to the general principle of soft decision value calculation. When a soft decision value is generated in the DEQPSK, according to the invention, there are eight modulation symbol candidates for a transmission bit 1, and it is necessary to determine an error from the received symbol for each of the modulation symbol candidates, and to search for the minimum value. There are eight candidate points for the transmission bit 0, and, also for this case, similarly the error calculation and the minimum value search are necessary. Moreover, an error between a received symbol and a candidate point is calculated as the square of a Euclidian distance, and a multiplier or a square circuit is necessary as hardware. Therefore, if the invention is realized by a digital circuit, the amount of calculation is large, and if the invention is implemented by a digital large scale integration (LSI) or a field-programmable gate array (FPGA), particularly if a plurality of circuits to which the invention is applied are operated in parallel, there arises such a problem that a large circuit scale and high power consumption are necessary.

The present invention is devised to solve the above-mentioned problem, and has an object of providing, for the differentially encoded modulation scheme, a soft decision value generation circuit capable of reducing the amount of calculation and the hardware scale for generating a soft decision value.

Solution to Problem

A soft decision value generation circuit according to the present invention includes: phase rotation means for rotating a phase of a received symbol after coherent detection; addition means for calculating, by using the phase-rotated received symbol, absolute values of soft decision values for soft decision value candidates restricted in advance; minimum value selection means for selecting a minimum value out of the absolute values of the soft decision values; and sign reflection means for reflecting, based on the phase of the received symbol after the phase rotation, sign information to the minimum value.

Advantageous Effects of Invention

The soft decision value generation circuit according to the present invention can provide such excellent effects that, for soft decision value candidates restricted in advance, a soft decision value can be calculated by simple arithmetic operations such as sign inversion processing and the addition/subtraction processing, the calculation amount and the circuit scale can be reduced, and further the power consumption can be reduced.

BRIEF DESCRIPTION OF DRAWINGS

FIG. 3 A table showing a mapping rule of DEQPSK.

FIG. 4 A table showing a reduction of soft decision value candidates by the soft decision value generation circuit according to the first embodiment of the present invention.

FIG. 5 A table showing an example of soft decision value calculation after the candidate reduction in a case where $r_1'$ exists in the first quadrant in the soft decision value generation circuit according to the first embodiment of the present invention.

FIG. 6 A table showing soft decision values after the candidate reduction for quadrants where $r_1'$ exists in the soft decision value generation circuit according to the first embodiment of the present invention.

FIG. 7 A table showing processing by a phase rotation unit of the soft decision value generation circuit according to the first embodiment of the present invention.

FIG. 8 A table showing processing by an addition unit of the soft decision value generation circuit according to the first embodiment of the present invention.

FIG. 9 A table showing processing by a sign reflection unit of the soft decision value generation circuit according to the first embodiment of the present invention.

FIG. 10 A block diagram illustrating a configuration of a conventional soft decision value generation circuit.

DESCRIPTION OF EMBODIMENTS

Figure 1:
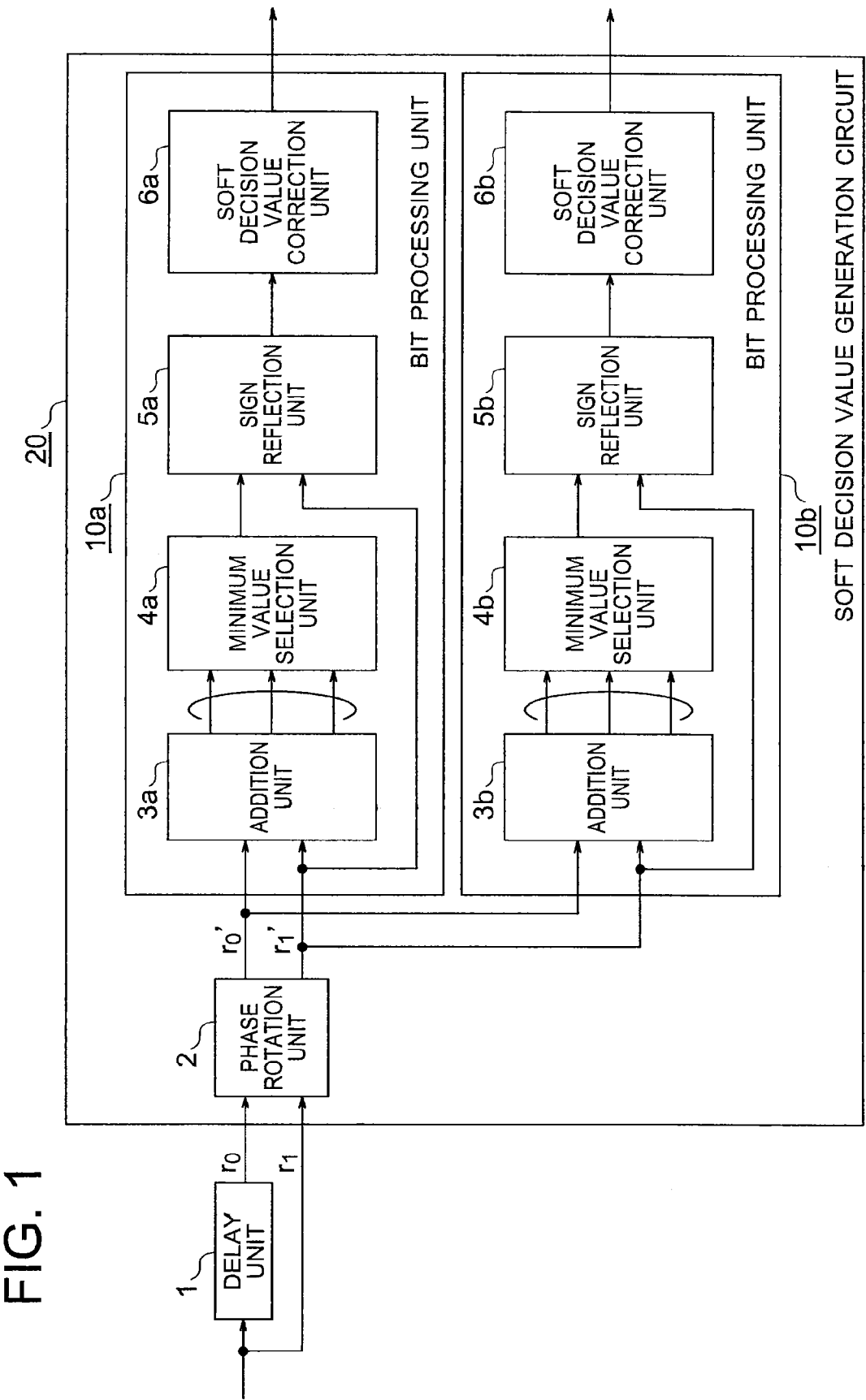
FIG. 1 A block diagram illustrating a configuration of a soft decision value generation circuit according to a first embodiment of the present invention.
Figure 2:
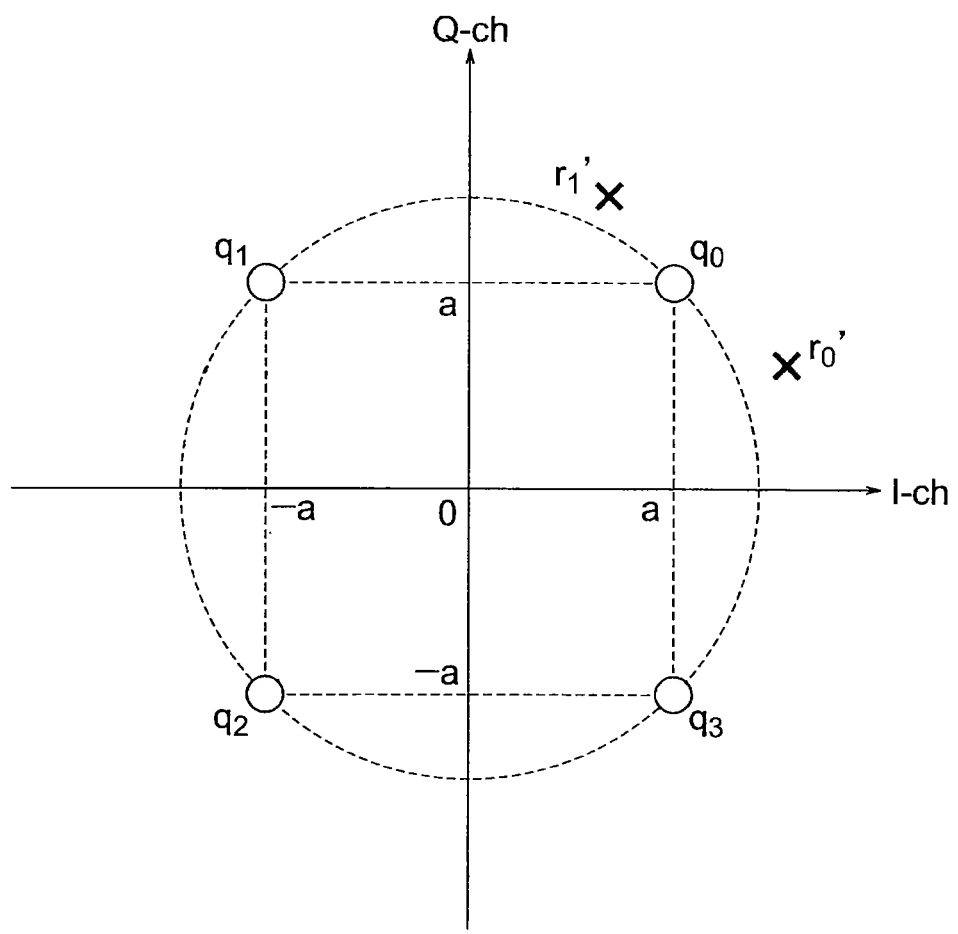
FIG. 2 A graph showing received symbol positions after a phase rotation by the soft decision value generation circuit according to the first embodiment of the present invention.

A description is now given of a preferred embodiment of a soft decision value generation circuit according to the present invention referring to drawings.

First as a prerequisite, a description is given of an operation of a conventional soft decision value generation circuit when the present invention is not applied.

Specifically, a description is given of a general idea of the soft decision value and an approximated value thereof, and a conventional method of generating a soft decision value from a received symbol after the coherent detection in a system using the DEQPSK modulation referring to drawings. The DEQPSK modulation dealt in the specification is the DEQPSK modulation without the π/4 shift. In other words, specific conceivable modulation points are, as described later, the same four points as those of the QPSK.

First, a description is given of the definition of the log likelihood ratio (LLR). Note that, both the conventional method and the present invention output an approximated LLR, which is described later, as the soft decision value.

A transmitted information (transmitted bit) series is represented by be (0,1), and the received signal is represented by r (complex number). A posterior probability P(b|r) that the transmitted information sequence is b when the received signal is r is represented by Equation (1) below by using the Bayes' theorem.

[Math. 1]

$$P(b \mid r) = P(r \mid b) \cdot \frac{P(b)}{P(r)} \tag{1}$$

Thus, the log likelihood ratio L(b|r) of b when the received signal is r is given by Equation (2) below.

[Math. 2]

$$\begin{aligned} L(b \mid r) &= \ln \frac{P(b=0 \mid r)}{P(b=1 \mid r)} \\ &= \ln \frac{P(r \mid b=0) \cdot \frac{P(b=0)}{P(r)}}{P(r \mid b=1) \cdot \frac{P(b=1)}{P(r)}} \\ &= \ln \frac{P(r \mid b=0)}{P(r \mid b=1)} + \ln \frac{P(b=0)}{P(b=1)} \end{aligned} \tag{2}$$

Note that, it is generally assumed in the transmitted information sequence b that the occurrence probability of 0 and the occurrence probability of 1 are equal to each other, and, thus, P(b=0)=P(b=1). In other words, it is assumed that the second term of Equation (2) is 0.

A probability density of the received signal r when $q_i$ is transmitted is given by Equation (3) below.

[Math. 3]

$$P(r \mid q_i) = \frac{1}{\sqrt{2\pi\sigma^2}} \exp\left(-\frac{|r - q_i|^2}{2\sigma^2}\right) \tag{3}$$

where $q_i$ (complex number) is a modulation symbol point, and $\sigma^2$ is a variance of Gaussian noise.

M bits are mapped to the modulation symbol $q_i$, and the bits are represented by $b_0, b_1, \ldots, b_{M-1}$, respectively. When a set of modulation symbol points having $b_k=0$ (0≤k≤M−1) is represented as C ($b_k=0$) and a set of modulation symbol points having $b_k=1$ is represented as C ($b_k=1$), and if the numbers of elements of the sets are equal, the log likelihood ratio L ($b_k|r$) of $b_k$ is given by Equation (4) below from Equation (2).

[Math. 4]

$$L(b_k \mid r) = \ln\frac{P(r \mid b_k = 0)}{P(r \mid b_k = 1)} \quad (4)$$

$$= \ln\frac{\sum_{q_i \in C(b_k=0)} p(r \mid q_i)}{\sum_{q_i \in C(b_k=1)} p(r \mid q_i)}$$

$$= \ln\frac{\sum_{q_i \in C(b_k=0)} \exp\left(-\frac{|r-q_i|^2}{2\sigma^2}\right)}{\sum_{q_i \in C(b_k=1)} \exp\left(-\frac{|r-q_i|^2}{2\sigma^2}\right)}$$

$$= \ln \sum_{q_i \in C(b_k=0)} \exp\left(-\frac{|r-q_i|^2}{2\sigma^2}\right) - \ln \sum_{q_i \in C(b_k=1)} \exp\left(-\frac{|r-q_i|^2}{2\sigma^2}\right)$$

Equation (4) which is an equation for calculating $L(b_k \mid r)$ includes an exponential sum for $q_i \in C(b_k=0)$ and an exponential sum for $q_i \in C(b_k=1)$, and when the numbers of elements of the sets $C(b_k=0)$ and $C(b_k=1)$ of modulation symbols subject to the summation are large, these exponential sums require an enormous amount of calculation. Thus, the LLR is approximated by using only the respective maximum terms for those exponential sums. This approximation method is referred to as logarithmic sum approximation by maximum.

[Math. 5]

$$L(b_k \mid r) \approx \ln \max_{q_i \in C(b_k=0)} \exp\left(-\frac{|r-q_i|^2}{2\sigma^2}\right) - \ln \max_{q_i \in C(b_k=1)} \exp\left(-\frac{|r-q_i|^2}{2\sigma^2}\right) \quad (5)$$

$$= \min_{q_i \in C(b_k=1)}\left(\frac{|r-q_i|^2}{2\sigma^2}\right) - \min_{q_i \in C(b_k=0)}\left(\frac{|r-q_i|^2}{2\sigma^2}\right)$$

$$= \frac{1}{2\sigma^2}\left\{\min_{q_i \in C(b_k=1)}(|r-q_i|^2) - \min_{q_i \in C(b_k=0)}(|r-q_i|^2)\right\}$$

$$= \lambda(b_k \mid r)$$

In other words, from the least square distance between the modulation symbol having $b_k=0$ and the received signal r, the least square distance between the modulation symbol having $b_k=1$ and the received signal r, and a noise power, the approximated LLR, $\lambda(b_k \mid r)$, can be derived.

A description is now given of the calculation of the approximated LLR in the DEQPSK modulation. A description is first given of the calculation by the conventional method.

A transmitted signal s(n) is given by Equations (6) and (7) below.

[Math. 6]

$$s(n) = s(n-1) \cdot e^{j\theta_n} \quad (6)$$

$$\theta_n = \begin{cases} 0 & (b_{2n}=0, b_{2n+1}=0) \\ \pi/2 & (b_{2n}=1, b_{2n+1}=0) \\ \pi & (b_{2n}=1, b_{2n+1}=1) \\ 3\pi/2 & (b_{2n}=0, b_{2n+1}=1) \end{cases} \quad (7)$$

where n is a sequence number, s(n) (complex number) is a transmission symbol of the DEQPSK, and $b_n$ is a transmitted information bit.

On this occasion, $s(0)=\sqrt{2}a \cdot e^{j\pi/4}$ is a start point. The variable a represents the absolute value of a transmission amplitude of the inphase channel (I-ch) and the quadrature-phase channel (Q-ch). As a result, the transmission symbols are arranged in the same constellation as that of the normal QPSK. The constellation of the normal QPSK includes four points: $q_0=(a,a)$, $q_1=(-a,a)$, $q_2=(-a,-a)$, and $q_3=(a,-a)$.

Now consider a case of obtaining, from successive received symbols r(n−1) and r(n), respective LLRs for two bits of information bits relating to the symbol transition. In the following, only symbol times n−1 and n are focused, and notations are simplified as represented by Equations (8) to (13) below. Moreover, the mapping rule for the DEQPSK is illustrated in FIG. 3.

[Math. 7]

$$s_0 \leftarrow s(n-1) \quad (8)$$

$$s_1 \leftarrow s(n) \quad (9)$$

$$r_0 \leftarrow r(n-1) \quad (10)$$

$$r_1 \leftarrow r(n) \quad (11)$$

$$b_0 \leftarrow b_{2n} \quad (12)$$

$$b_1 \leftarrow b_{2n+1} \quad (13)$$

Equation (2) is a definition of the LLR in a case where one received symbol and transmitted information are associated with each other. For a symbol differentially encoded, the transmitted information is contained in a state transition between successive two symbols, and a log likelihood ratio $L(b_k \mid r_0, r_1)$ for the bit $b_k$ (k=0, 1) in this case is given by Equation (14) below.

[Math. 8]

$$L(b_k \mid r_0, r_1) = \ln\frac{P(r_0, r_1 \mid b_k = 0)}{P(r_0, r_1 \mid b_k = 1)} \quad (14)$$

Equation (14) is expanded as represented by Equation (15) below. Note that, a set of a combination of modulation symbol points $s_0$ and $s_1$ having $b_k=0$ is represented by $D(b_k=0)$, and a set of a combination of modulation symbol points $s_0$ and $s_1$ having $b_k=1$ is represented by $D(b_k=1)$.

[Math. 9]

$$L(b_k \mid r_0, r_1) = \ln \frac{\sum_{(q_i, q_j) \in D(b_k=0)} p(r_0, r_1 \mid s_0 = q_i, s_1 = q_j)}{\sum_{(q_i, q_j) \in D(b_k=1)} p(r_0, r_1 \mid s_0 = q_i, s_1 = q_j)} \quad (15)$$

$$= \ln \frac{\sum_{(q_i, q_j) \in D(b_k=0)} \frac{1}{\sqrt{2\pi\sigma^2}} \exp\left(-\frac{|r_0 - q_i|^2}{2\sigma^2}\right) \cdot \frac{1}{\sqrt{2\pi\sigma^2}} \exp\left(-\frac{|r_1 - q_j|^2}{2\sigma^2}\right)}{\sum_{(q_i, q_j) \in D(b_k=1)} \frac{1}{\sqrt{2\pi\sigma^2}} \exp\left(-\frac{|r_0 - q_i|^2}{2\sigma^2}\right) \cdot \frac{1}{\sqrt{2\pi\sigma^2}} \exp\left(-\frac{|r_1 - q_j|^2}{2\sigma^2}\right)}$$

$$= \frac{\sum_{(q_i, q_j) \in D(b_k=0)} \exp\left(-\frac{|r_0 - q_i|^2}{2\sigma^2}\right) \cdot \exp\left(-\frac{|r_1 - q_j|^2}{2\sigma^2}\right)}{\sum_{(q_i, q_j) \in D(b_k=1)} \exp\left(-\frac{|r_0 - q_i|^2}{2\sigma^2}\right) \cdot \exp\left(-\frac{|r_1 - q_j|^2}{2\sigma^2}\right)}$$

On this occasion, similarly to Equation (5), when the logarithmic sum approximation by maximum is applied, an approximated LLR represented by Equation (16) below is obtained.

[Math. 10]

$$\lambda(b_k \mid r_0, r_1) = \ln \max_{(q_i, q_j) \in D(b_k=0)} \exp\left(-\frac{|r_0 - q_i|^2}{2\sigma^2}\right) \cdot \exp\left(-\frac{|r_1 - q_j|^2}{2\sigma^2}\right) - \quad (16)$$

$$\ln \max_{(q_i, q_j) \in D(b_k=1)} \exp\left(-\frac{|r_0 - q_i|^2}{2\sigma^2}\right) \cdot \exp\left(-\frac{|r_1 - q_j|^2}{2\sigma^2}\right)$$

$$= \min_{(q_i, q_j) \in D(b_k=1)} \left(\frac{|r_0 - q_i|^2}{2\sigma^2} + \frac{|r_1 - q_j|^2}{2\sigma^2}\right) - \min_{(q_i, q_j) \in D(b_k=0)} \left(\frac{|r_0 - q_i|^2}{2\sigma^2} + \frac{|r_1 - q_j|^2}{2\sigma^2}\right)$$

$$= \frac{1}{2\sigma^2} \left\{ \min_{(q_i, q_j) \in D(b_k=1)} (|r_0 - q_i|^2 + |r_1 - q_j|^2) - \min_{(q_i, q_j) \in D(b_k=0)} (|r_0 - q_i|^2 + |r_1 - q_j|^2) \right\}$$

When a modulation symbol point closest to $r_0$ is represented by $q_{m0}$, and a modulation symbol point closest to $r_1$ is represented by $q_{m1}$, Equation (16) is represented by Equation (17) below.

[Math. 11]

$$\lambda(b_k \mid r_0, r_1) = \begin{cases} \frac{1}{2\sigma^2} \left\{ \min_{(q_i, q_j) \in D(b_k=1)} (|r_0 - q_i|^2 + |r_1 - q_j|^2) - (|r_0 - q_{m0}|^2 + |r_1 - q_{m1}|^2) \right\} & (q_{m0}, q_{m1}) \in D(b_k = 0) \\ \frac{1}{2\sigma^2} \left\{ (|r_0 - q_{m0}|^2 + |r_1 - q_{m1}|^2) - \min_{(q_i, q_j) \in D(b_k=0)} (|r_0 - q_i|^2 + |r_1 - q_j|^2) \right\} & (q_{m0}, q_{m1}) \in D(b_k = 1) \end{cases} \quad (17)$$

The approximated LLR given by Equation (17) is an LLR obtained by the conventional method. The conventional method is more specifically considered. When a case where k=0, namely, $b_0$ is considered, and if $q_{m0}$ and $q_{m1}$ belong to the set $D(b_0=0)$, $b_0=0$ is the maximum likelihood bit, and the approximated LLR is calculated by the upper equation of Equation (17). In other words, the likelihood of $b_0=0$ is uniquely determined (second terrain the upper equation of Equation (17)), and a combination giving the minimum square distance needs to be searched for from combination candidates $(q_i, q_j)$ for giving the inverted bit $b_0=1$ (first term in the upper equation of Equation (17)). From FIG. 3, there are eight candidates of the combination $(q_i, q_j)$ giving the inverted bit $b_0=1$, and, for calculating the approximated LLR for $b_0$, a search from eight combination candidates is necessary for each received symbol. For a case where the $b_0=1$ is the maximum likelihood bit, the approximated LLR is calculated by the lower equation of Equation (17), and searching eight combination candidates giving $b_0=0$ is similarly necessary. The same holds true for $b_1$. Thus, if the conventional method is realized by hardware, there arise such problems that the amount of calculation is large, considerable circuit scale is required, and considerable power consumption is required.

FIG. 10 is a block diagram illustrating a configuration of a soft decision value generation circuit which realizes the conventional method. In the following, like reference symbols denote like or corresponding components throughout the drawings.

In FIG. 10, a conventional soft decision value generation circuit 30a includes a maximum-likelihood-bit likelihood calculation unit 31a, a square error minimum value selection unit 32a, a log likelihood ratio calculation unit 33a, a sign reflection unit 34a, and a soft decision value correction unit 35a.

Moreover, a conventional soft decision value generation circuit 30b includes, similarly to the soft decision value generation circuit 30a, includes a maximum-likelihood-bit likelihood calculation unit 31b, a square error minimum value selection unit 32b, a log likelihood ratio calculation unit 33b, a sign reflection unit 34b, and a soft decision value correction unit 35b. A delay unit 1 is provided at a prior stage of the soft decision value generation circuits 30a and 30b.

The soft decision value generation circuit 30a generates a soft decision value for $b_0$, and the soft decision value generation circuit 30b generates a soft decision value for $b_1$. For the sake of simple description, in the following, a description is given of the soft decision value generation circuit 30a for generating the soft decision value for $b_0$.

A received symbol, which is input, is first branched so that one of the branched symbols is input to the delay unit 1 and the other thereof is directly input as $r_1$ to the soft decision value generation circuit 30a. The delay unit 1 delays the input received symbol by one symbol. An output of the delay unit 1 is input as $r_0$ to the soft decision value generation circuit 30a.

The maximum-likelihood-bit likelihood calculation unit 31a determines, respectively by using the received symbol $r_0$ input from the delay unit 1, and the received symbol $r_1$ input from the input side (prior stage) of the delay unit 1, the maximum likelihood points $q_{m0}$ and $q_{m1}$, and determines the maximum likelihood bit of $b_0$. The determined maximum likelihood bit is output to the square error minimum value selection unit 32a and the sign reflection unit 34a. Moreover, the likelihood of the maximum likelihood bit is calculated. The likelihood of the maximum likelihood bit is determined by using terms corresponding to $q_{m0}$ and $q_{m1}$ in Equation (17), namely Equation (18) below.

[Math. 12]

$$\lambda_m(b_0|r_0,r_1)=|r_0-q_{m0}|^2+|r_1-q_{m1}|^2 \qquad (18)$$

The determined likelihood is output to the log likelihood ratio calculation unit 33a.

The square error minimum value selection unit 32a determines an inverted bit of the maximum likelihood bit of $b_0$ input from the maximum-likelihood-bit likelihood calculation unit 31a. By using the received symbol $r_0$ input from the delay unit 1 and the received symbol $r_1$ input from the input side of the delay unit 1, for all the eight candidates (refer to FIG. 3) of the combination of $r_0$ and $r_1$, which give the inverted bit, the likelihood of an inverted bit term in Equation (17) is determined. In other words, Equation (19) below is calculated for all the eight candidates of the combination.

[Math. 13]

$$\lambda_r(b_0|r_0,r_1)=|r_0-q_{r0}|^2+|r_1-q_{r1}|^2 \qquad (19)$$

On this occasion, $q_{r0}$ and $q_{r1}$ respectively represent candidate points of the inverted bits corresponding to $r_0$ and $r_1$. The calculation of Equation (19) is carried out for all the eight candidates, and the minimum value $\lambda_{rm}(b_0|r_0, r_1)$ thereof is determined, and is, as the likelihood of the inverted bit, output to the log likelihood ratio calculation unit 33a.

The log likelihood ratio calculation unit 33a determines, by using $\lambda_m(b_0|r_0,r_1)$ and $\lambda_{rm}(b_0|r_0,r_1)$ respectively input from the maximum-likelihood-bit likelihood calculation unit 31a and the square error minimum value selection unit 32a, the absolute value of the approximated LLR (it should be noted, however, that the coefficient $1/(2\sigma^2)$ is not reflected). The absolute value of the approximated LLR is calculated by using Equation (20) below.

[Math. 14]

$$\overline{\lambda}(b_0|r_0,r_1)=\lambda_{rm}(b_0|r_0,r_1)-\lambda_m(b_0|r_0,r_1) \qquad (20)$$

On this occasion, $\lambda_m(b_0|r_0, r_1)$ is a likelihood determined by using the maximum likelihood candidate point and hence always satisfies a relationship: $\lambda_{rm}(b_0|r_0, r_1) \geq \lambda_m(b_0|r_0, r_1)$, and $(-)\overline{\lambda}(b_0|r_0, r_1)$ is always a nonnegative value (note that, $(-)\lambda$ denotes overlined $\lambda$). The calculated value is output to the sign reflection unit 34a.

The sign reflection unit 34a reflects, based on the maximum likelihood bit input from the maximum-likelihood-bit likelihood calculation unit 31a, the sign to the value input from the log likelihood ratio calculation unit 33a. Specifically, when the maximum likelihood bit is $b_0=1$, the negative sign is given to the absolute value of the approximated LLR. In other words, the processing by the sign reflection unit 34a is represented by Equation (21) below.

[Math. 15]

$$\lambda'(b_0|r_0,r_1) = \begin{cases} \overline{\lambda}(b_0|r_0,r_1) & (q_{m0}, q_{m1}) \in D(b_0 = 0) \\ -\overline{\lambda}(b_0|r_0,r_1) & (q_{m0}, q_{m1}) \in D(b_0 = 1) \end{cases} \qquad (21)$$

$\lambda'(b_0|r_0, r_1)$ determined by Equation (21) is output to the soft decision value correction unit 35a.

The soft decision value correction unit 35a multiplies the value input from the sign reflection unit 34a by $1/(2\sigma^2)$. In other words, the processing by the soft decision value correction unit 35a is represented by Equation (22) below.

[Math. 16]

$$\lambda(b_0|r_0,r_1) = \frac{1}{2\sigma^2} \cdot \lambda'(b_0|r_0,r_1) \qquad (22)$$

$\lambda(b_0|r_0,r_1)$ determined by Equation (22) is output as a calculation result by the soft decision value generation circuit 30a.

The description has been given of the fact that the conventional approximated LLR for the bit $b_0$ can be calculated by the soft decision value generation circuit 30a constituted of the maximum-likelihood-bit likelihood calculation unit 31a, the square error minimum value selection unit 32a, the log likelihood ratio calculation unit 33a, the sign reflection unit 34a, and the soft decision value correction unit 35a. The approximated LLR for the bit $b_1$ can also be calculated by carrying out the processing by the same procedures in the soft decision value generation circuit 30b. It should be noted, however, that the square error minimum value selection units 32a and 32b need to carry out the square error calculation of Equation (19) for all the eight candidates of the combination of the inverted bit and to search for the minimum value, and hence the conventional method has the problem of the large amount of calculation.

In the present invention, a circuit is configured so as to reduce the calculation processing amount in view of the approximated LLR calculation method in the above-mentioned conventional method.

First Embodiment

A description is given of the soft decision value generation circuit according to the first embodiment of the present invention referring to FIGS. 1 to 9. FIG. 1 is a block diagram

[Math. 18]

$$\lambda(b_k \mid r_0, r_1) = \begin{cases} \dfrac{1}{2\sigma^2} \left\{ \min_{(q_i, q_j) \in D(b_k=1)} (|r'_0 - q_i|^2 + |r'_1 - q_j|^2) - \\ (|r'_0 - q'_{m0}|^2 + |r'_1 - q'_{m1}|^2) \right\} & (q'_{m0}, q'_{m1}) \in D(b_k = 0) \\ \dfrac{1}{2\sigma^2} \left\{ (|r'_0 - q'_{m0}|^2 + |r'_1 - q'_{m1}|^2) - \\ \min_{(q_i, q_j) \in D(b_k=0)} (|r'_0 - q_i|^2 + |r'_1 - q_j|^2) \right\} & (q'_{m0}, q'_{m1}) \in D(b_k = 1) \end{cases} \quad (26)$$

illustrating a configuration of the soft decision value generation circuit according to the first embodiment of the present invention.

In FIG. 1, the soft decision value generation circuit 20 according to the first embodiment of the present invention includes a phase rotation unit (phase rotation means) 2, a bit processing unit 10a, and a bit processing unit 10b. The delay unit (delay means) 1 is described later.

The bit processing unit 10a includes an addition unit (addition means) 3a, a minimum value selection unit (minimum value selection means) 4a, a sign reflection unit (sign reflection means) 5a, and a soft decision value correction unit (soft decision value correction means) 6a. Moreover, the bit processing unit 10b includes an addition unit (addition means) 3b, a minimum value selection unit (minimum value selection means) 4b, a sign reflection unit (sign reflection means) 5b, and a soft decision value correction unit (soft decision value correction means) 6b.

The bit processing unit 10a is a processing unit for $b_0$, and the bit processing unit 10b is a processing unit for $b_1$. The bit processing unit 10a and the bit processing unit 10b have the same configuration.

First, a description is given of a principle of a soft decision value generation method according to the present invention.

In the differentially encoded PSK, only the relative phase difference between the successive two symbols is considered, and hence a phase rotation in units of $\Pi/2$ is applied to $r_0$ so that $r_0$ is positioned in the first quadrant and the symbol after the phase rotation is $r_0'$. Moreover, $r_1'$ is obtained by applying the same phase rotation to $r_1$. Moreover, the symbols are expressed as $r_0 = (u_0, v_0)$, $r_1 = (u_1, v_1)$, $r_0' = (x_0, y_0)$, and $r_1' = (x_1, y_1)$. On this occasion, relationships between the symbols before and after the phase rotation are represented by Equations (23), (24), and (25) below.

[Math. 17]

$$r'_0 = r_0 \cdot e^{j\phi} \quad (23)$$

$$r'_1 = r_1 \cdot e^{j\phi} \quad (24)$$

$$\phi \begin{cases} 0 & (u_0 \geq 0, v_0 \geq 0) \\ \pi/2 & (u_0 \geq 0, v_0 < 0) \\ \pi & (u_0 < 0, v_0 < 0) \\ 3\pi/2 & (u_0 < 0, v_0 \geq 0) \end{cases} \quad (25)$$

Assuming that a modulation symbol point closest to $r_0'$ is $q_{m0}'$ and a modulation symbol point closest to $r_1'$ is $q_{m1}'$, the approximated LLR is represented by Equation (26) below.

In the following, the LLR of the bit $b_0$, $\lambda(b_0, r_0, r_1)$, when $r_1'$ exists in the first quadrant (FIG. 2) is expanded.

$r_0'$ exists in the first quadrant, and hence a relationship $q_{m0}' = q_0$ always holds true. $r_1'$ is in the first quadrant, and hence a relationship $q_{m1}' = q_0$ always holds true. The information bit $b_0$ for the transition $q_0 \to q_0$ is 0 (refer to FIG. 3), and $\lambda(b_0|r_0, r_1)$ is thus represented by Equation (27) below.

[Math. 19]

$$\lambda(b_0 \mid r_0, r_1) \dfrac{1}{2\sigma^2} \left\{ \min_{(q_i, q_j) \in D(b_0=1)} (|r'_0 - q_i|^2 + |r'_1 - q_j|^2) - \\ (|r'_0 - q_0|^2 + |r'_1 - q_0|^2) \right\} \quad (27)$$

The following equation for the eight transitions $(q_i \to q_j)$ satisfying $(q_i, q_j) \in D(b_0=1)$ (refer to FIG. 3) is shown in FIG. 4.

[Math. 20]

$$|r'_0 - q_i|^2 + |r'_1 - q_j|^2|_{(q_i, q_j) \in D(b_0=1)}$$

As shown in FIG. 4, $r_1'$ exists in the first quadrant, and hence item numbers (2), (3), (5), (6), and (8) cannot be the minimum value. Thus, only three item numbers (1), (4), and (7) need to be subjected to the calculation.

Then, Equation (27) is expanded to Equation (28) below.

[Math. 21]

$$\lambda(b_0 \mid r_0, r_1) \dfrac{1}{2\sigma^2} \min_{(q_i, q_j) \in D(b_0=1)} \left( \begin{array}{l} |r'_0 - q_i|^2 + |r'_1 - q_j|^2 - \\ |r'_0 - q_0|^2 - |r'_1 - q_0|^2 \end{array} \right) \quad (28)$$

As shown in FIG. 5, the following expression in Equation (28) is specifically determined for the item numbers (1), (4), and (7) of FIG. 4.

[Math. 22]

$$|r_0' - q_i|^2 + |r_1' - q_j|^2 - |r_0' - q_0|^2 - |r_1' - q_0|^2$$

As illustrated in FIG. 5, the number of specific candidate values can be restricted to three.

Thus, $\lambda(b_0|r_0,r_1)$ when $r_1'$ exists in the first quadrant is determined by Equation (29) below.

[Math. 23]

$$\lambda(b_0 | r_0, r_1) = \frac{2a}{\sigma^2} \cdot \min(x_1, x_0 + y_1, y_0) \qquad (29)$$

Coefficient $2a/\sigma^2$ is common to the three candidate values, and may be multiplied after the selection of the minimum value.

Similarly, an approximated LLR, $\lambda(b_1|r_0,r_1)$, when $r_1'$ is in the first quadrant, and further $\lambda(b_0|r_0,r_1)$ and $\lambda(b_1|r_0,r_1)$ when $r_1'$ is respectively in the second, third, and fourth quadrants can be determined. A table for those correspondences is shown in FIG. 6. As shown in FIG. 6, it is appreciated that, by separating cases based on the quadrant where $r_1'$ exists, the candidate values of $\lambda(b_0|r_0,r_1)$ and $\lambda(b_1|r_0,r_1)$ are respectively restricted to four values. By determining the minimum value of those candidate values, $\lambda(b_0|r_0,r_1)$ and $\lambda(b_1|r_0,r_1)$ can be calculated. Moreover, it is also appreciated that $\lambda(b_0|r_0,r_1)$ and $\lambda(b_1|r_0,r_1)$ can be calculated by the simple processing such as the sign inversion processing and the addition/subtraction processing. Note that, the coefficient $2a/\sigma^2$ is omitted for the values shown in FIG. 6.

In the following section, for the sake of simple description, a description is given of an approximated LLR calculation method for $b_0$. In other words, a description is given of operations of the phase rotation unit 2 and the bit processing unit 10a.

The phase rotation unit 2 applies the phase rotation to the received symbol $r_0$ input from the delay unit 1 and the received symbol $r_1$ input from the input side of the delay unit 1. The phase rotation applies a rotation in units of 90 degrees to each of the symbols so that $x_0 \geq 0$ and $y_1 \geq 0$ are satisfied. The rotation processing in units of 90 degrees can be realized by inverting the sign and switching the I-ch (real part) and the Q-ch (imaginary part) with each other. A table for those correspondences is shown in FIG. 7. $r_0'$ and $r_1'$ obtained by the application of the phase rotation are respectively output to the addition unit 3a.

The addition unit 3a determines, based on $r_0'$ and $r_1'$ respectively input from the phase rotation unit 2, three values of soft decision value candidates by addition. FIG. 8 shows a summary of the processing by the addition unit 3a. In FIG. 8, processing for both the bits $b_0$ and $b_1$, namely processing by both the addition units 3a and 3b are shown. Note that, all the three values to be determined are non-negative. The determined three values are output to the minimum value selection unit 4a.

The minimum value selection unit 4a determines the minimum value of the three values input from the addition unit 3a. The determined minimum value is output to the sign reflection unit 5a.

The sign reflection unit 5a reflects, based on $r_1'$ input from the phase rotation unit 2, the sign to the value input from the minimum value selection unit 4a. FIG. 9 shows a summary of the processing by the sign reflection unit 5a. In FIG. 9, processing for both the bits $b_0$ and $b_1$, namely processing by both the sign reflection units 5a and 5b are shown. As appreciated from FIG. 9, the sign is reflected depending on the phase of $r_1'$. The value to which the sign has been reflected is output to the soft decision value correction unit 6a.

The soft decision value correction unit 6a multiplies the value input from the sign reflection unit 5a by the coefficient $2a/\sigma^2$. It should be noted, however, that when an estimated noise level is fixed, the coefficient $2a/\sigma^2$ has a fixed value, and the multiplication is multiplication by a fixed value. The multiplication by a fixed value is realized by a method without using a multiplier, such as a method of using a bit shift and an adder and a table search method of searching a reference table for an output, and the multiplication by the soft decision value correction units 6a and 6b does not influence the increase in processing amount and the increase in circuit scale so much. This holds true for the soft decision value correction units 35a and 35b of the conventional method. In this way, the value multiplied by the coefficient $2a/\sigma^2$ is set as the approximated LLR, and is output as a calculation result by the soft decision value generation circuit 20.

In this way, the approximated LLR for the bit $b_0$ according to this embodiment can be easily generated by the phase rotation unit 2 and the bit processing unit 10a. The approximated LLR for the bit $b_1$ can also be easily generated by the phase rotation unit 2 and the bit processing unit 10b. The processing for the bit $b_1$ is included in the above description, and a detailed description thereof is therefore omitted.

Note that, the soft decision value generation circuit 20 according to this embodiment does not include the delay unit 1 for delaying the received symbol by one symbol. However, the present invention is not limited thereto, and the delay unit 1 may be included in the soft decision value generation circuit 20.

The soft decision value generation circuit 20 according to this embodiment includes the soft decision value correction units 6a and 6b for multiplying by the coefficient $2a/\sigma^2$. However, for example, in a case where an error correction decoder at a posterior stage carries out soft decision Viterbi decoding, it is only necessary to distinguish a relative relationship in magnitude among the soft decision values, and the multiplication by the coefficient $2a/\sigma^2$ is not necessary. Thus, the present invention is not limited to the above-mentioned embodiment, and the soft decision value correction units 6a and 6b may not be included in the soft decision value generation circuit 20.

Moreover, according to this embodiment, the subject communication system may use wired communication or a wireless communication. Moreover, the communication system may be multi-carrier communication or single-carrier communication.

Note that, the method of the present invention may be applied to the DEBPSK modulation. In this case, though the effect of reducing the soft decision value candidates compared with the conventional method cannot be provided, the square error calculation required by the conventional method can be eliminated, and, as described in this embodiment, the soft decision value can be easily generated by the sign inversion processing, the addition/subtraction processing, and the comparison processing.

The soft decision value generation circuit 20 according to this embodiment can reduce the soft decision value candidates compared with the conventional case, and the soft decision value can be simply calculated by the sign inversion processing, the addition/subtraction processing, and the comparison processing in the DEQPSK modulation.

The present invention has been described based on the embodiment. It should be understood that various variations are conceivable in the combination of respective components and processing processes of the embodiment.

As described above, the soft decision value generation circuit 20 according to the present invention is useful for a reception device and a signal processing device which carry out the soft decision decoding.

REFERENCE SIGNS LIST 1 delay unit, 2 phase rotation unit, 3a, 3b addition unit, 4a, 4b minimum value selection unit, 5a, 5b sign reflection unit, 6a, 6b soft decision value correction unit, 10a bit processing unit, 10b bit processing unit, 20 soft decision value generation circuit.

The invention claimed is:

1. A soft decision value generation circuit, comprising:
   phase rotation means for rotating a phase of a received symbol after coherent detection;
   addition means for calculating, by using the phase-rotated received symbol, absolute values of soft decision values for soft decision value candidates, wherein a number of the soft decision value candidates, of a number of possible soft decision value candidates, is restricted by the addition means in advance of the absolute value calculation;
   minimum value selection means for selecting a minimum value out of the absolute values of the soft decision values; and
   sign reflection means for assigning, based on the phase of the received symbol after the phase rotation, a sign to the minimum value to generate a soft decision value.

2. The soft decision value generation circuit according to claim 1, further comprising
   soft decision value correction means for multiplying an output of the sign reflection means by a coefficient depending on a noise variance value and an amplitude value of a modulation symbol.

3. The soft decision value generation circuit according to claim 2, further comprising
   delay means provided prior to the phase rotation means, for delaying the received symbol by one symbol.

4. The soft decision value generation circuit according to claim 1, further comprising
   delay means provided prior to the phase rotation means, for delaying the received symbol by one symbol.

5. The soft decision value generation circuit according to claim 1, wherein
   the number of the soft decision value candidates is restricted in advance based on a phase of the phase-rotated received symbol.

6. A device comprising
   circuitry configured to:
   rotate, as a phase rotation process, a phase of a received symbol after coherent detection;
   calculate, by using the phase-rotated received symbol, absolute values of soft decision values for soft decision value candidates, wherein a number of the soft decision value candidates, of a number of possible soft decision value candidates, is restricted by the circuitry in advance of the absolute value calculation;
   select a minimum value out of the absolute values of the soft decision values; and
   assign, as a sign reflection process that is based on the phase of the received symbol after the phase rotation, a sign to the minimum value to generate a soft decision value.

7. The device according to claim 6, wherein
the circuitry is further configured to multiply an output of the sign reflection process by a coefficient depending on a noise variance value and an amplitude value of a modulation symbol.

8. The device according to claim 7, further comprising
a delay unit, implemented by the circuitry, provided prior to the phase rotation process, configured to delay the received symbol by one symbol.

9. The device according to claim 6, further comprising
a delay unit, implemented by the circuitry, provided prior to the phase rotation process, configured to delay the received symbol by one symbol.

10. The device according to claim 6, wherein
the number of the soft decision value candidates is restricted in advance by the circuitry based on a phase of the phase-rotated received symbol.

11. A soft decision value generation method, comprising:
rotating a phase of a received symbol after coherent detection;
calculating, by using the phase-rotated received symbol, absolute values of soft decision values for soft decision value candidates, wherein a number of the soft decision value candidates, of a number of possible soft decision value candidates, is restricted in advance of the absolute value calculation;
selecting a minimum value out of the absolute values of the soft decision values; and
assigning, based on the phase of the received symbol after the phase rotation, a sign to the minimum value to generate a soft decision value.

12. The soft decision value generation method according to claim 11, further comprising
multiplying an output of the assigning by a coefficient depending on a noise variance value and an amplitude value of a modulation symbol.

13. The soft decision value generation method according to claim 12, further comprising
prior to the rotating, delaying the received symbol by one symbol.

14. The soft decision value generation method according to claim 11, further comprising
prior to the rotating, delaying the received symbol by one symbol.

15. The soft decision value generation method according to claim 11, wherein
the number of the soft decision value candidates is restricted in advance based on a phase of the phase-rotated received symbol.

* * * * *